United States Patent
Sommer et al.

(10) Patent No.: US 8,309,981 B2
(45) Date of Patent: Nov. 13, 2012

(54) LED MODULE WITH COLOR CONVERSION LAYER DESIGNED FOR A HOMOGENOUS COLOR DISTRIBUTION

(75) Inventors: Christian Sommer, Graz (AT); Franz-Peter Wenzl, St. Johann ob Hohenburg (AT); Peter Pachler, Graz (AT); Paul Hartmann, Weiz (AT)

(73) Assignee: Ledon Lighting Jennersdorf GmbH, Jennersdorf (AT)

( * ) Notice: Subject to any disclaimer, the term of this patent is extended or adjusted under 35 U.S.C. 154(b) by 408 days.

(21) Appl. No.: 12/527,179

(22) PCT Filed: Apr. 18, 2008

(86) PCT No.: PCT/EP2008/003159
§ 371 (c)(1),
(2), (4) Date: Feb. 2, 2010

(87) PCT Pub. No.: WO2008/131877
PCT Pub. Date: Nov. 6, 2008

(65) Prior Publication Data
US 2010/0127293 A1    May 27, 2010

(30) Foreign Application Priority Data
Apr. 30, 2007   (EP) .................................. 07107205

(51) Int. Cl.
*H01L 33/50* (2010.01)
(52) U.S. Cl. .................... 257/95; 257/E33.059; 438/22

(58) Field of Classification Search .................... 257/89, 257/95, E25.02, E33.059; 313/498, 502, 313/506; 438/22, 33, 82, 99
See application file for complete search history.

(56) References Cited

U.S. PATENT DOCUMENTS

| | | | |
|---|---|---|---|
| 6,635,363 B1 | 10/2003 | Duclos et al. | |
| 6,642,652 B2 | 11/2003 | Collins, III et al. | |
| 6,650,044 B1 | 11/2003 | Lowery | |
| 6,963,166 B2 | 11/2005 | Yano et al. | |
| 7,078,732 B1 | 7/2006 | Reeh et al. | |
| 2004/0097006 A1* | 5/2004 | Lowery | 438/99 |
| 2004/0100192 A1* | 5/2004 | Yano et al. | 313/512 |
| 2006/0071223 A1 | 4/2006 | Richter et al. | |

FOREIGN PATENT DOCUMENTS

| | | |
|---|---|---|
| EP | 1198016 A2 | 4/2002 |
| EP | 1411557 A2 | 4/2004 |
| EP | 1418630 A1 | 5/2004 |
| WO | WO-2006048064 A1 | 5/2006 |

OTHER PUBLICATIONS

International Search Report for PCT/EP2008/003159 dated Jul. 18, 2009.

\* cited by examiner

*Primary Examiner* — Thomas L Dickey
(74) *Attorney, Agent, or Firm* — Marshall, Gerstein & Borun LLP

(57) ABSTRACT

An LED module having an LED semiconductor chip mounted directly or indirectly on a platform. The platform is made from silicon and is extends laterally beyond the LED semiconductor chip having an active light emitting layer and a substrate. At least one electronic component that is part of the control circuitry for the LED semiconductor chip is integrated in the silicon platform.

30 Claims, 5 Drawing Sheets

LED MODULE WITH COLOR CONVERSION LAYER DESIGNED FOR A HOMOGENOUS COLOR DISTRIBUTION

BACKGROUND OF THE INVENTION

1. Field of the Invention

The present invention relates to the field of generating light using semiconductor devices, which will be called LEDs in the following. The invention is particularly useful for generating white light by having an LED emitting light of a first spectrum and mixing this light with a second spectrum generated by partially converting the light having the first spectrum. This conversion will be called color conversion in the following.

2. Related Technology

The color of the emitted (mixed) light obviously depends on the ratio of converted light to light of the original first spectrum. This ratio in turn depends on the effective path length of the light of the first spectrum when travelling through a color conversion layer. The effective path length can be different for different emission angles, which results in an uneven color temperature when looking at the angular distribution of the far field pattern illuminated by an LED module. It further depends on the superposition of the respective radiation patterns that are different for light originating of the semiconductor emitter (close to lambertian shape) and the converted light (isotropic luminescence). The color variation in most conventional types of LEDs typically manifests itself as a cooler white in the middle with a warmer white or yellowish ring off axis in the light beam. This implicates that the geometry of the color conversion layer is a factor for the homogeneity of the color temperature of the LED module.

It is known that a geometrically well defined (so-called "conformal") coating of the color conversion layer on the LED chip is improving the angular homogeneity of the color temperature.

U.S. Pat. No. 6,650,044 is directed on a device and a manufacturing method (Stenciling) resulting in a configuration of a phosphor layer that is substantially a conformal Coating on a Flip-chip-Geometry, having a substantially uniform thickness essentially with surfaces in parallel to the side planes of the flip chip LED.

U.S. Pat. No. 6,642,652 proposes an LED device uniformly covered by a Phosphor conversion layer (single or multiple layer) with substantially constant thickness (thickness deviates max. 10% from average) above the top surface and adjacent to the sides of the semiconductor stack. The conversion layer does not significantly increase the size of the source compared to the bare LED. It is also limited to the LED and does not cover submounts or reflectors or PCB by more than 100 μm.

U.S. Pat. No. 7,078,732 proposes a color conversion layer that is disposed directly on a semiconductor body and shows a substantially constant layer thickness throughout. In FIG. 3 of this prior art document a color conversion element is shown that is placed on top of a housing where the LED chip is placed in a recess. The void space is filled with a transparent material. The conversion layer has substantially constant thickness and exceeds the active region of the LED chip. In this example the layer is, however, not "directly" disposed on the semiconductor.

US 2006/0071223A1 teaches a color conversion layer that is purposefully structured to achieve a homogeneous color space over all viewing angles. The structure is described as having periodically changing thickness or recessed regions (at the edges of the chip).

U.S. Pat. No. 6,963,166 shows an LED lamp with a resin portion (conversion layer) that covers at least one side surface of the LED flip chip, and with a curved reflector separated from the side surface that is needed to obtain the desired angular homogeneity.

U.S. Pat. No. 6,635,363 shows an LED with phosphor layer whose thickness is proportional to the intensity of the emitted radiation of the underlying LED, to improve homogeneity of the emitted radiation.

SUMMARY OF THE INVENTION

The invention provides well defined optimized color conversion layers, which promote the homogenous color distribution of an LED module.

The invention has found out that, in order to achieve a homogeneous color distribution, certain dimensions of the color conversion layer are of advantage and that this effect can be further improved by adapting the dimensions of the color conversion layer depending on the concentration of the color conversion substance and/or the average dimensions of the color conversion particles.

The invention provides an LED module, comprising:

an LED chip comprising a semiconductor layer structure on a substrate, the layer structure having an active light emitting area, and an color conversion layer for converting the wavelength of light emitted from the LED chip into a second wavelength, wherein the color conversion layer has an essentially uniform thickness h and laterally extends beyond the active light emitting area by a non-zero length x on each side of light emitting layer, wherein x is smaller than h.

The surface of the LED chip directing to the color conversion layer can be provided with periodic or aperiodic microstructures that typically present vertical dimensions that are in the order of micrometers.

The surface of the color conversion layer directing away from the LED chip can be provided with periodic or aperiodic microstructures in the portion of the color conversion layer extending beyond the light emitting layer of the LED chip and/or the portion of the color conversion layer which overlaps the light emitting layer of the LED chip. Again, these microstructures can have vertical dimension which typically are in the order of micrometers.

The color conversion layer can be also at least partially covering the side surfaces of the LED chip, wherein the thickness d of the color conversion layer at the side surfaces of the LED chip is smaller than the height h of the color conversion layer.

The invention also applies to an LED device that is constructed with a thin and substantially transparent intermediate layer (for example a glueing layer) between the surface of the LED semiconductor chip and the color conversion layer. The invention also applies to an LED device where this intermediate layer is used as a scattering layer.

The ratio d/h can be selected between 0.001 and 0.99, preferably between 0.007 and 0.67.

The height h can be between 50 and 1000 μm, preferably between 100 and 800 μm.

The concentration of the color conversion substance in the color conversion layer can be selected between 2 and 50 vol %, preferably 4 to 40 vol %.

The parameter x can be selected to be between 1 and 300 μm, preferably between 5 and 150 μm.

The d50 (average diameter) value of the grain size of the color conversion particles can be between 1 and 50, preferably 2 and 25 μm.

The invention has found out that the ratio h/x plays a role for a uniform color distribution of the LED module: The ratio h/x can be between 1.01 and 1000, preferably not more than 160.

The ratio h/x can be between 1.5 and 140 for a concentration of the color conversion substance between 5 and 20 vol % of the total material of the color conversion layer.

The invention has found out that the ratio of h and the concentration c of the color conversion substance in the color conversion layer plays a role for a uniform color distribution and can be selected to be between 1 and 500, preferably between 2.5 and 200 μm/vol %.

The invention has determined that the ratio of x and the concentration c of the color conversion substance in the color conversion layer plays a role for a homogeneous color distribution and can be selected to be between 0.02 and 150, preferably between 0.125 and 37.5 μm/vol %.

The color conversion layer can be provided as a prefabricated foil member.

The color conversion layer can be provided directly or indirectly, i.e. by means of other elements (adhesive layer etc.) on the top surface of the LED chip.

The color conversion layer can be a prefabricated member which is glued or fixed otherwise to the top surface of the LED chip.

The color conversion layer can be directly dispensed on the top surface of the LED chip.

A further aspect of the invention relates to a method for improving the homogeneity of the color distribution of a white LED module, the LED module comprising a color conversion layer on top of a LED semiconductor chip, the method comprising the step of disposing a color conversion layer, setting the height h of the color conversion layer, and adjusting the width x of the layer and the concentration c of the color conversion substance depending on the height of the color conversion layer.

The method can comprise the step of setting the ratio of h and the concentration c of the color conversion substance in the color conversion layer to a value of between 1 and 500, preferably between 2.5 and 200 μm/vol %, and setting the ratio of h and the width of the extension x of the layer to a value of between 1.01 and 1000, preferably not more than 160.

Another aspect of the invention relates to a method for producing a LED device of substantially white emission of a desired correlated color temperature with improved homogeneity of the color distribution, the LED device comprising a color conversion layer on top of a LED semiconductor chip, the color conversion layer laterally extending beyond the active light emitting surface of the LED chip by a distance of x at each side, the method comprising the step of disposing a color conversion layer, setting the lateral extension x of the color conversion layer and adjusting the height h of the layer and the concentration c of the color conversion substance depending on the value of x of the layer.

The method can comprise the step of setting the ratio of x and the concentration c of the color conversion substance in the color conversion layer to a value of between 0.02 and 150, preferably between 0.125 and 37.5 μm/vol % and setting the ratio of h and the width of the extension x of the layer to a value of between 1.01 and 1000, preferably not more than 160.

Another aspect of the invention relates to a method for producing an LED device of substantially white emission of a desired correlated color temperature with improved homogeneity of the color distribution, the LED device comprising a color conversion layer on top of a LED semiconductor chip, the method comprising the step of disposing a color conversion layer including a color conversion substance having a concentration c, and adjusting the height h of the layer and the width x of the extension of the color conversion layer depending on the value of the concentration c.

The method can comprise the step of setting the ratio of x and the concentration c of the color conversion substance in the color conversion layer to a value of between 0.02 and 150, preferably between 0.125 and 37.5 μm/vol % and setting the ratio of h and the concentration c of the color conversion substance in the color conversion layer to a value of between 1 and 500, preferably between 2.5 and 200 μm/vol %.

BRIEF DESCRIPTION OF THE DRAWINGS

Further objects, aspects and advantages of the invention will be explained by means of the following detailed description of preferred embodiments of the invention, when taken in conjunction with the figures of the enclosed drawings.

DETAILED DESCRIPTION

Figure 1:
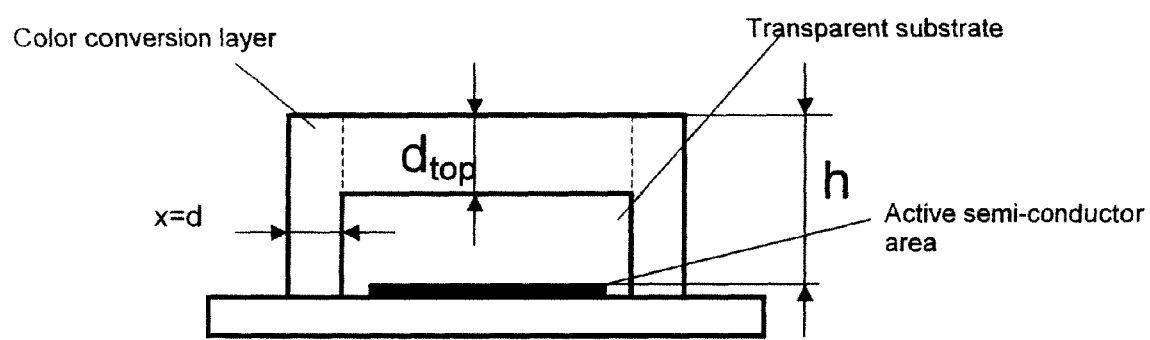
FIG. 1 shows an LED module according to the present invention, wherein the LED chip is mounted face-up.

The present invention can be applied e.g. for a) a diced thin-GaN surface emitting LED chip, and b) a diced flip chip LED that uses a sapphire substrate (or a similar transparent material of substantially same refractive index) and that has its emissive (GaN or similar) layer at the bottom of the LED.

Diced LED chips can be of either quadratic or rectangular shape.

The color conversion layer according to the present invention comprises luminescent particles (powders or small crystals), the phosphor or "color conversion substance", in a supportive matrix (for example, a polymer matrix) that is transparent to visible radiation.

The invention is likewise applicable also to color conversion layers that contain molecular luminophores that are dispersed homogeneously (i.e. forming a "solid solution" of luminophore molecules in the supportive matrix).

The invention proposes a color conversion layer with a lateral "extension" that exceeds the "central layer", where the central layer covers the active light emitting layer of the semiconductor structure, which is the confined area on the top surface of the LED chip that provides the outcoupling of light (in case of a flip-chip geometry the light is coupling primarily to the transparent substrate).

According to the invention, a phosphor conversion layer is positioned between the light-emitting semiconductor structure and the environment or secondary optics, exceeding the geometry of the active area of the semiconductor die by an extension that has a substantially rectangular cross section of length x and height h in all 4 sides of a quadratic or rectangular LED chip.

The central part of the conversion layer that covers the active area of the chip preferably has an average thickness that does not change substantially over the whole active light emitting area, and is similar to the height h of the extension. Preferably it is equal to h.

The bottom and top surface of the central part, however, are not necessarily parallel, since (i) the surface of the LED chip may contain microstructures (e.g., Pyramids) to better extract light from the semiconductor layers, and (ii) the surface of the central layer may contain microstructures (different from those of the surface of the chip). On a macroscopic level, they are preferably parallel.

The form of the total phosphor conversion layer (that is the central layer plus the extension) is chosen to minimize the color variation over all emission angles in the far field.

In one embodiment the surface of the extension may be substantially plane, regardless of the shape of the central layer. In particular it may be a layer with substantially parallel planes.

In another embodiment the surface of the extension and/or the central layer are periodically structured, for example by rectangular grooves or by sinusoidal waves. In such cases the height h is understood as an average parameter.

In another embodiment the surface of the extension and/or the central layer are aperiodically structured.

The effective broadness of the layer is $b = b_{active} + 2*x$, whereas $x > 0$ in any rate. The parameters x (resp. b), h, and the concentration c of a certain color conversion substance (with certain emission and excitation spectra, and certain absorption coefficient κ and quantum efficiency) that is suspended in a supportive matrix (e.g., a polymer as silicone, with refractive index n) are dependent on each other to generate a homogenous light distribution over all emission angles in the far field of the LED (generating white light in that a significant proportion of the exciting blue wavelength range is still coming through and mixing with the yellow, green, or red light of the phosphor layer). Deviation from these preferred sets of parameters result in a substantial deviation from homogeneity of the emitted color.

The invention is not limited to the use of just one type of color conversion substance, but the ideas can be applied likewise to a combination of different color conversion substances. In this case the accumulated concentration as well as the averaged grain size $d_{50,avg}$ can be applied within the given ranges as well for layers containing multiple color conversion substances.

Figure 2:
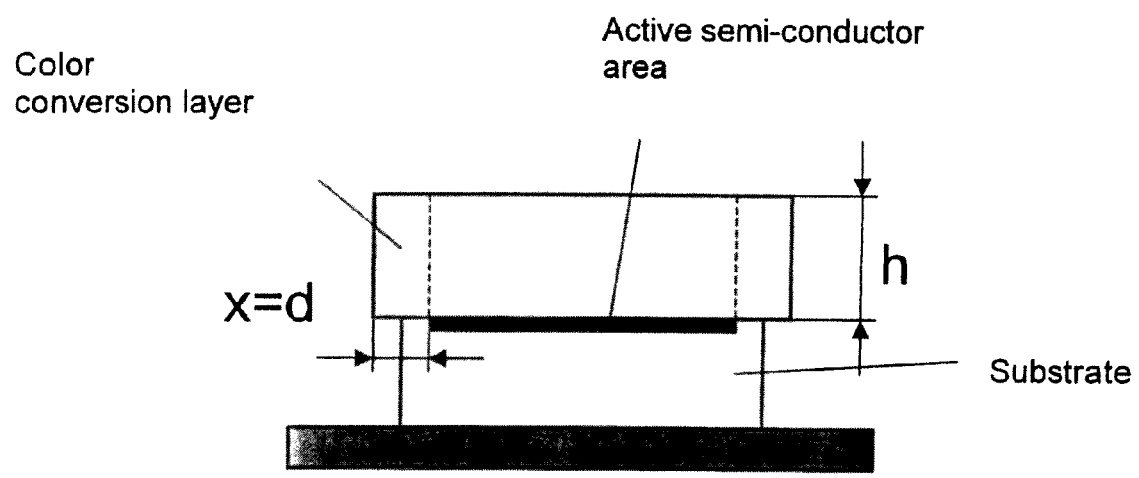
FIG. 2 shows a LED module according to the present invention, wherein the LED chip is mounted face-down (flip-chip)

In case of a flip-chip geometry (FIG. 2) a sapphire or other transparent material is placed above the emissive GaN layer (for which it serves as a substrate), and the phosphor conversion layer is placed on top of it. The Sapphire is cut substantially at 90° angles, providing a rectangular crystal that is transparent to the radiation of the LED die. The sapphire provides 1 top and 4 side planes for light extraction. The top and side planes are covered directly (i.e. without an air gap extending over the complete interface area between the LED chip and the color conversion layer) by a color conversion layer (again, a phosphor dispersed in a supportive matrix).

The thickness of the top layer (the color conversion layer that is covering the top sapphire surface) is adjusted to meet the requirements of homogeneous white light emission. The parameters h and x and c are in a similar way interdependent to yield a homogeneous light distribution. This situation is equivalent to the thin-GaN version except that the sapphire is "occupying" some space within the block of the color conversion layer. This means that $x = d$, and $h = d_{top} + d_{sap}$ (where $d_{sap}$ is the thickness of the sapphire).

Adjusting the parameter triple x (resp. b), h, and c is decisive to achieve a good homogeneity of the color in the far field. To obtain the best homogeneity of white light emission of a desired color temperature over all angles, the thickness of the excess layer height h (and hence, $d_{top}$) and the excess length x (and hence the side layer thickness d) are chosen in a certain ratio that also depends on the concentration of the phosphor in the matrix.

According to the practical considerations, certain optimum parameter sets of x or respectively d, h or respectively $d_{top}$, and c can be provided. This set of parameters is different for various achievable white light color temperatures.

The following table shows preferred values for the parameters h, c, x, d50 and cct (color temperature):

|  |  | Values |  | Preferred values |  |
|---|---|---|---|---|---|
|  |  | min | max | min | Max |
| h | μm | 50 | 1000 | 100 | 800 |
| c | vol. % | 2 | 50 | 4 | 40 |
| x | μm | 1 | 300 | 5 | 150 |
| d50 | μm | 1 | 50 | 2 | 25 |
| cct | K | 2700 | 10000 | 2700 | 7500 |
| h/c | μm/vol % | 1 | 500 | 2.5 | 200 |
| h/x | 1 | 1.01 | 1000 | 1.01 | 160 |
| h/d50 | 1 | 1 | 1000 | 4 | 400 |
| h/cct | μm/K | 0.005 | 0.37 | 0.013 | 0.296 |
| x/c | μm/vol % | 0.02 | 150 | 0.125 | 37.5 |
| d50/c | μm/vol % | 0.02 | 25 | 0.05 | 6.25 |
| Cct/c | K/vol % | 54 | 5000 | 67.5 | 1875 |
| x/d50 | 1 | 0.02 | 300 | 0.2 | 75 |
| x/cct | μm/K | 0.0001 | 0.1 | 0.00067 | 0.056 |
| d50/cct | μm/K | 0.0001 | 0.0185 | 0.00027 | 0.009 |

Figure 3:
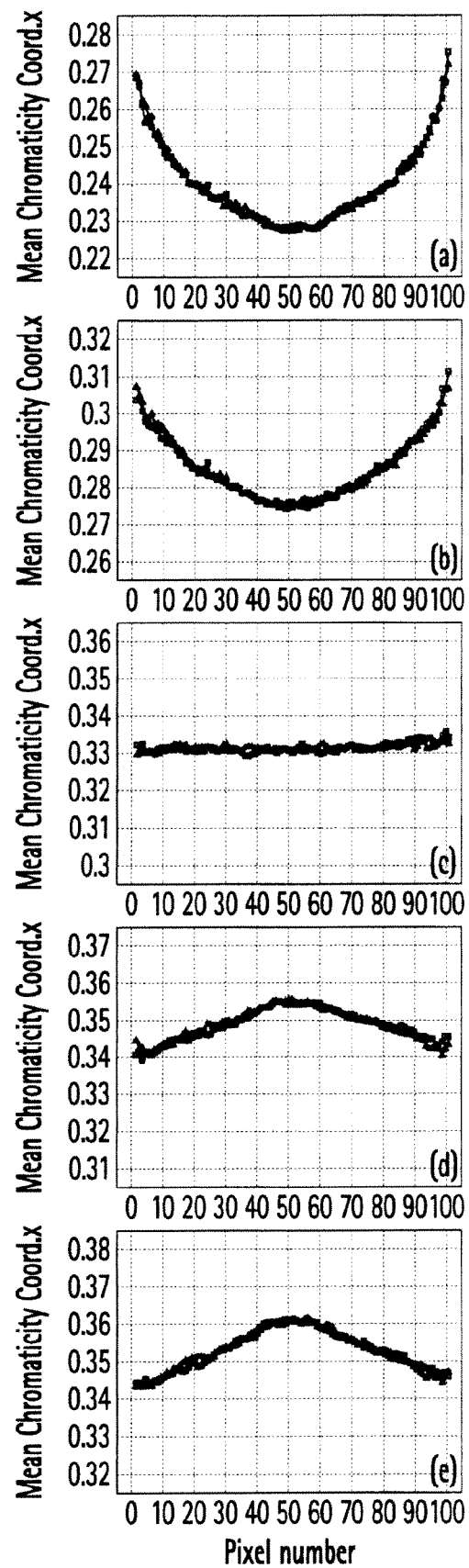
FIG. 3 shows the mean chromaticity coordinate x' for a constant total layer width b of 1040 μm (x=50 μm, for a chip whose active layer has a width of 940 μm) and a phosphor concentration of 10% vol., and different layer thickness (a) 100 μm, (b) 200 μm, (c) 400 μm (optimized), (d) 600 μm, and (e) 700 μm. here: x=0,5*(b−940 μm)

FIG. 3 shows the mean chromaticity coordinate x' for a constant total layer width of 1040 μm (x=50 μm) and a phosphor concentration of 10% vol. for different layer thickness, wherein
 (a) 100 μm,
 (b) 200 μm
 (c) 400 μm (optimized)
 (d) 600 μm, and
 (e) 700 μm.

Figure 4:
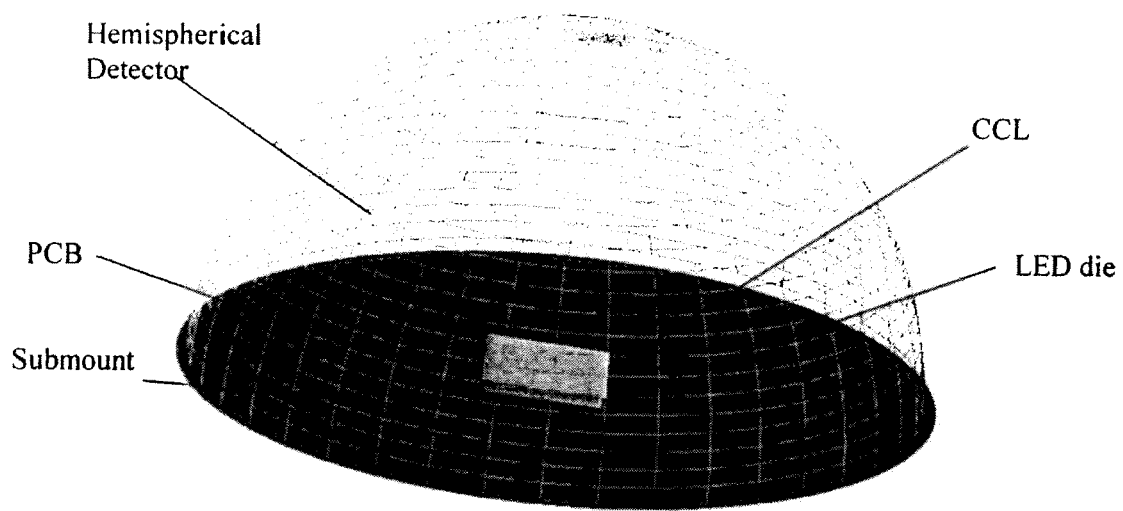
FIG. 4 shows a sketch of far field used in the simulation model with a hemispherical detector (radius: 1 cm) on top.

The mean chromaticity coordinate is shown as a function of the pixel number of a hemispherical detector as shown in FIG. 4.

Figure 5:
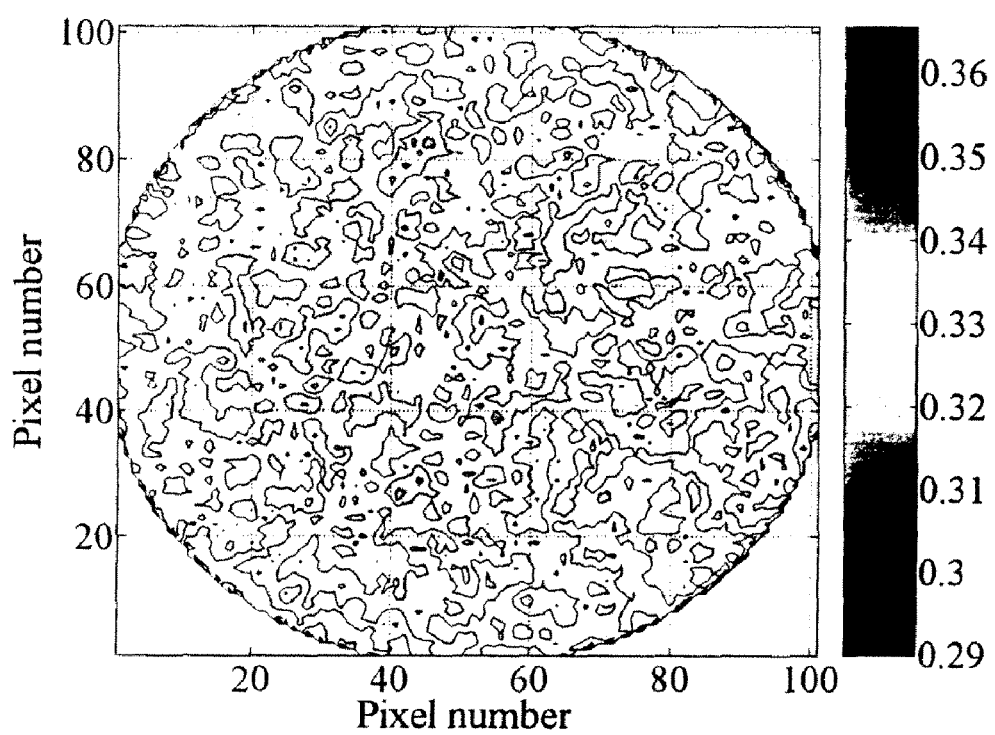
FIG. 5 shows a Contour plot of the chromaticity coordinate x' for the optimized parameter triple according to FIG. 3 c: layer thickness h=400 μm, a total layer width of 1040 μm (x=50 μm) and a phosphor concentration of 10% vol.; x=0, 5*(b−940 μm).

FIG. 5 shows a planar two-dimensional view of the pixel numbers of the hemispherical detector.

The pixel number 50 corresponds to the coordinate of the hemispherical detector which is positioned right over the center of the active light emitting area of the LED chip. The pixel numbers 0 and 100, respectively, correspond to a viewing angle of 0° and 180°, respectively.

FIG. 3 shows that the optimized layer thickness h=400 μm gave the best (most homogeneous) angular color distribution result for the total width of 1040 μm, a lateral excess extension of x=50 μm and the phosphor concentration of 10% volume.

The invention claimed is:
1. An LED module, comprising:
 an LED chip having an active light emitting area, and a color conversion layer for converting light of a first wavelength emitted from the LED chip into light of a second wavelength, wherein the color conversion layer comprises a color conversion substance in the form of particles having a grain size with a d50 value between 1 μm and 50 μM, has a uniform thickness h, and extends laterally beyond the active light emitting area by a non-zero length x on each side of the active light emitting area, wherein x is smaller than h.

2. The LED module according to claim 1, wherein the surface of the LED chip directing to the color conversion layer is provided with periodic or aperiodic microstructures.

3. The LED module according to claim 1, wherein the surface of the color conversion layer opposite to the LED chip is provided with periodic or aperiodic microstructures in the portion of the color conversion layer extending beyond the light emitting layer of the LED chip and/or the portion of the color conversion layer that overlaps the light emitting layer of the LED chip.

4. The LED module according to claim 1, wherein the color conversion substance at least partially covers side surfaces of the LED chip, and wherein the thickness d of the color conversion layer at the side surfaces of the LED chip is smaller than the height h of the color conversion layer.

5. The LED module according to claim 4, wherein the ratio d/h is selected between 0.001 and 0.99.

6. The LED module according to claim 4, wherein the ratio d/h is selected between 0.007 and 0.67.

7. The LED module according to claim 1, wherein h is between 50 μm and 1000 μm.

8. The LED module according to claim 1, wherein the concentration of the color conversion substance in the color conversion layer is between 2 vol % and 50 vol %.

9. The LED module according to claim 1, wherein x is between 1 μm and 300 μm.

10. The LED module according to claim 1, wherein the ratio h/x is between 1.01 and 1000.

11. The LED module according to claim 10, wherein the ratio h/x is between 1.5 and 140 for a concentration of the color conversion substance between 5 vol % and 20 vol % of the total material of the color conversion layer.

12. The LED module according to claim 1, wherein the ratio of h and the concentration c of the color conversion substance in the color conversion layer is between 1 μm/vol % and 500 μm/vol %.

13. The LED module according to claim 1, wherein the ratio of x and the concentration c of the color conversion substance in the color conversion layer is between 0.02 μm/vol % and 150 μm/vol %.

14. The LED module according to claim 1, wherein the color conversion layer is provided as a prefabricated foil member.

15. The LED module according to claim 1, wherein the color conversion layer is provided directly or indirectly on the top surface of the LED chip.

16. The LED module according to claim 1, wherein the color conversion layer is a prefabricated member glued to the top surface of the LED chip.

17. The LED module according to claim 1, wherein the color conversion layer is directly dispensed on the top surface of the LED chip.

18. The LED module according to claim 1, wherein h is between 100 μm and 800 μm.

19. The LED module according to claim 1, wherein the concentration of the color conversion substance in the color conversion layer is between 4 vol % and 40 vol %.

20. The LED module according to claim 1, wherein x is between 5 μm and 150 μm.

21. The LED module according to claim 1, wherein a d50 value of the grain size of the color conversion particles is between 2 μm and 25 μm.

22. The LED module according to claim 1, wherein the ratio h/x is between 1.01 and 160.

23. The LED module according to claim 1, wherein the ratio of h and the concentration c of the color conversion substance in the color conversion layer is between 2.5 μm/vol % and 200 μm/vol %.

24. The LED module according to claim 1, wherein the ratio of x and the concentration c of the color conversion substance in the color conversion layer is between 0.125 μm/vol % and 37.5 μm/vol %.

25. A method for producing an LED device with an improved homogeneity of an angular color distribution of a white LED module, the method comprising:
disposing a color conversion layer comprising a color conversion substance of a height h on top of an LED chip, the LED chip having an active light-emitting layer,
wherein the color conversion layer has a uniform thickness h and extends laterally beyond the active light-emitting area by a non-zero length x on each side of the active light emitting area,
adjusting the extension width x over the active light emitting layer and the concentration of the color conversion substance, wherein x is smaller than h, and,
setting a ratio of h to a concentration c of the color conversion substance in the color conversion layer to a value of between 1 μm/vol % and 500 μm/vol %, and setting a ratio h/x between 1.01 and 1000.

26. The method for producing a white LED device with improved homogeneity of the color distribution according to claim 25, comprising setting the ratio of h to the concentration c of the color conversion substance in the color conversion layer to a value of between 2.5 μm/vol % and 200 μm/vol % and/or setting the ratio h/x between 1.01 and 160.

27. A method for producing an LED device with an improved homogeneity of an angular color distribution of a white LED module, the method comprising:
disposing a color conversion layer that comprises a color conversion substance laterally extending beyond an active light-emitting surface of an LED chip by a distance of x at each side of the active light-emitting area, wherein the color conversion layer has an uniform thickness h and extends laterally beyond the active light-emitting area by a non-zero length x on each side of the active light emitting area, wherein x is smaller than h, and
setting a ratio of x to the concentration c of the color conversion substance in the color conversion layer to a value of between 0.02 μm/vol % and 150 μm/vol %, and setting a ratio h/x between 1.01 and 1000.

28. The method for improving the homogeneity of the color distribution of a white LED module according to claim 27, comprising setting the ratio of x to the concentration c of the color conversion substance in the color conversion layer to a value of between 0.125 μm/vol % and 37.5 μm/vol and/or setting the ratio h/x between 1.01 and 160.

29. A method for producing an LED device with an improved homogeneity of an angular color distribution of a white LED module, the method comprising:
disposing a color conversion layer having a color conversion substance of concentration c on top of an LED chip having an active light-emitting area, wherein the color conversion layer has a uniform thickness h and extends laterally beyond the active light-emitting area by a non-zero length x on each side of the active light emitting area of the LED chip, wherein x is smaller than h, and setting a ratio of a height h of the color conversion layer to the concentration c of the color conversion substance in the color conversion layer to a value of between 1 μm/vol % and 500 μm/vol %, and setting a ratio of an extension width x over the active area to the concentration c of the color conversion substance in the color conversion layer to a value of between 0.02 μm/vol % and 150 μm/vol %.

30. The method for producing a white LED device with improved homogeneity of the color distribution according to claim 29, comprising setting the ratio of h to the concentration c of the color conversion substance in the color conversion layer to a value of between 2.5 μm/vol % and 200 μm/vol % and/or setting the ratio of x to the concentration c of the color conversion substance in the color conversion layer to a value of between 0.125 μm/vol % and 37.5 μm/vol %.

* * * * *